(12) United States Patent
Ko (10) Patent No.: US 9,076,992 B2
(45) Date of Patent: Jul. 7, 2015

(54) METHOD FOR PREVENTING SHORT CIRCUIT BETWEEN METAL WIRES IN ORGANIC LIGHT EMITTING DIODE DISPLAY DEVICE

(71) Applicant: Shenzhen China Star Optoelectronics Technology Co., Ltd., Shenzhen, Guangdong (CN)

(72) Inventor: Kai-Yuan Ko, Guangming (CN)

(73) Assignee: SHENZHEN CHINA STAR OPTOELECTRONICS TECHNOLOGY CO., LTD., Shenzhen (CN)

( * ) Notice: Subject to any disclaimer, the term of this patent is extended or adjusted under 35 U.S.C. 154(b) by 23 days.

(21) Appl. No.: 14/129,992

(22) PCT Filed: Nov. 28, 2013

(86) PCT No.: PCT/CN2013/088056
§ 371 (c)(1),
(2) Date: Dec. 30, 2013

(87) PCT Pub. No.: WO2015/024321
PCT Pub. Date: Feb. 26, 2015

(65) Prior Publication Data
US 2015/0140714 A1      May 21, 2015

(30) Foreign Application Priority Data

Aug. 19, 2013 (CN) .......................... 2013 1 0361689

(51) Int. Cl.
*H01L 27/32* (2006.01)
*H01L 51/56* (2006.01)
(52) U.S. Cl.
CPC ............ *H01L 51/56* (2013.01); *H01L 27/3276* (2013.01); *H01L 2251/5392* (2013.01); *H01L 2227/323* (2013.01)

(58) Field of Classification Search
CPC ..... H01L 51/56; H01L 27/3276; H05B 33/06
USPC ............................ 257/40–48, 642–643, 759, 257/E51.001–E51.052, E25.008–E25.009; 438/46
See application file for complete search history.

(56) References Cited

U.S. PATENT DOCUMENTS

2002/0180671 A1* 12/2002 Inukai ............................ 345/76
2003/0224547 A1    12/2003 Lee et al.
2006/0183394 A1     8/2006 Kim et al.
(Continued)

FOREIGN PATENT DOCUMENTS

CN         1828839 A      9/2006
CN       102761312 A     10/2012

*Primary Examiner* — Mamadou Diallo
(74) *Attorney, Agent, or Firm* — JMB Davis Ben-David (57) ABSTRACT

Disclosed is a method for preventing a short circuit between metal wires in an organic light emitting diode display device. The method includes: forming an inorganic layer on a substrate; forming a metal layer including two metal wires on the inorganic layer; forming an organic layer on the two metal wires; forming an indium tin oxide layer on the organic layer; coating a photoresist layer; performing an exposure step by utilizing a photo mask having a transparent area, an opaque material disposed in the transparent area, wherein a width of the opaque material is less than a width of the transparent area; performing a development step to the photoresist layer; and performing an etching step to remove a part of the indium tin oxide layer and a part of the organic layer. The present invention can prevent the short circuit between the metal wires.

16 Claims, 7 Drawing Sheets

(56) References Cited

U.S. PATENT DOCUMENTS

| | | | |
|---|---|---|---|
| 2008/0258138 A1* | 10/2008 | Song et al. | 257/40 |
| 2011/0272714 A1* | 11/2011 | Lhee | 257/88 |
| 2013/0020564 A1* | 1/2013 | Kobayashi et al. | 257/40 |
| 2014/0014913 A1* | 1/2014 | Lee | 257/40 |

* cited by examiner

METHOD FOR PREVENTING SHORT CIRCUIT BETWEEN METAL WIRES IN ORGANIC LIGHT EMITTING DIODE DISPLAY DEVICE

BACKGROUND OF THE INVENTION

1. Field of the Invention

The present invention generally relates to an organic light emitting diode display device field, and more particularly to a method for preventing a short circuit between metal wires in an organic light emitting diode display device.

2. Description of Prior Art

An organic light emitting diode (OLED) display device has advantages of self-luminescent, lower power consumption, and wide viewing angle, and thus the organic light emitting diode display device is regarded as a display device with high development potential in the future.

Figure 1:
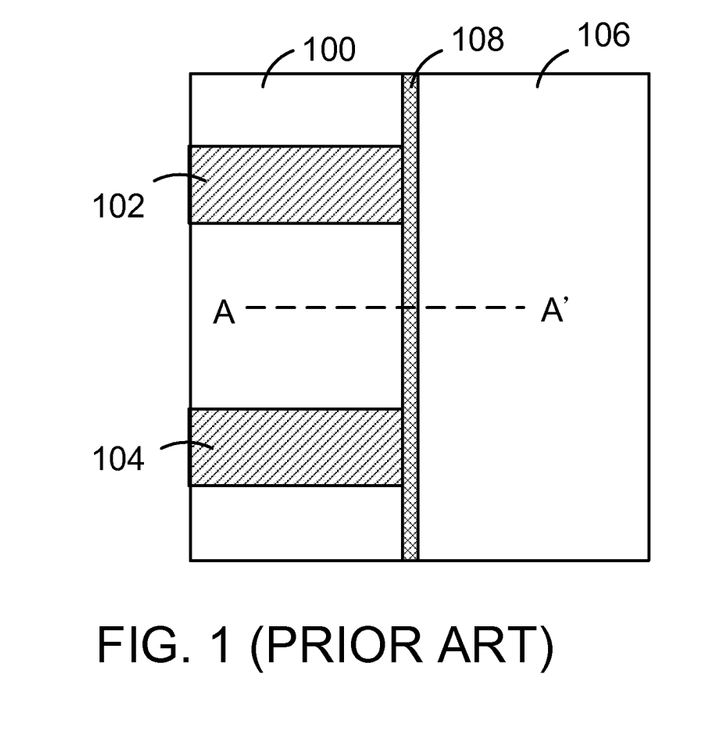
FIG. 1 illustrates a top view of some elements of a conventional organic light emitting diode display device.
Figure 2:
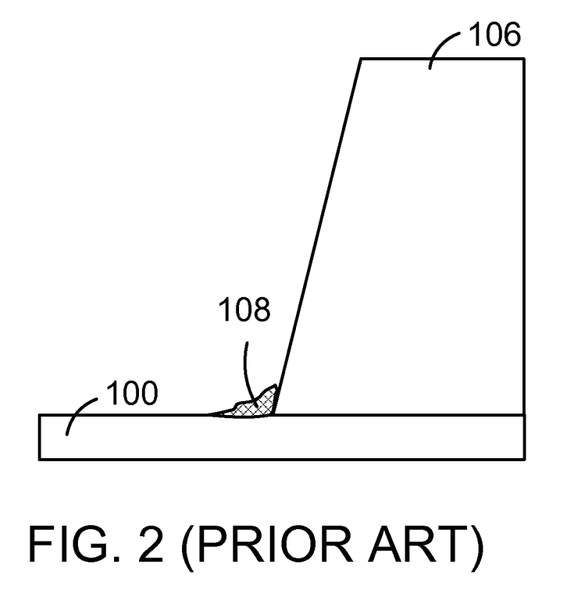
FIG. 2 illustrates a cross-sectional view along a line AA' in FIG. 1.

Please refer to FIG. 1 and FIG. 2. FIG. 1 illustrates a top view of some elements of a conventional organic light emitting diode display device. FIG. 2 illustrates a cross-sectional view along a line AA' in FIG. 1.

In a manufacturing process of the organic light emitting diode display device, a plurality of thin film transistors which are served as switch elements are manufactured on a substrate (not shown) firstly, and then organic light emitting diodes which are served as light emitting elements are manufactured.

Manufacturing the thin film transistors and the light emitting diodes comprises the following steps. Firstly, a gate layer (not shown) and a semiconductor layer (not shown) are formed on the substrate (not shown). Then, an inorganic layer 100 is formed, and a metal layer is formed on the inorganic layer 100. The metal layer comprises metal wires 102 and 104 for respectively transmitting independent signals, that is, for transmitting different signals. An organic layer 106 is formed on the metal wires 102 and 104. An indium tin oxide (ITO) layer 108 is formed on the organic layer 106. The indium tin oxide layer 108 is utilized as an anode of an organic light emitting diode. Finally, a light emitting layer (now shown) and a cathode (not shown) are formed on the indium tin oxide layer 108.

However, in the manufacturing process of the organic light emitting diode display device, a photoresist layer (not shown) is formed on the indium tin oxide layer 108 after the indium tin oxide layer 108 is deposited. During an exposure step, a top of the organic layer 106 masks out a bottom of the indium tin oxide layer 108 because the organic layer 106 is too thick. Accordingly, the bottom of the indium tin oxide layer 106 cannot be irradiated by light. That is, the organic layer 106 generates shadowing effect. As a result, after an etching step is performed and the photoresist layer (not shown) is removed, a fraction of the indium tin oxide layer 108 is left as shown in FIG. 2, so that a short circuit occurs between the metal wires 102 and 104.

Consequently, there is a need to solve the problem that the short circuit occurs between the metal wires 102 and 104 because the fraction of the indium tin oxide layer 108 is left.

SUMMARY OF THE INVENTION

An objective of the present invention is to provide a method for preventing a short circuit between metal wires in an organic light emitting diode display device capable of solving the problem that a short circuit occurs between metal wires because an indium tin oxide layer is left.

To solve the above-mentioned problem, a method for preventing a short circuit between metal wires in an organic light emitting diode display device provided by the present invention comprises:

forming an inorganic layer on a substrate;

forming a metal layer on the inorganic layer, the metal layer comprising at least two metal wires;

forming an organic layer on the two metal wires of the metal layer;

forming an indium tin oxide layer on the organic layer;

coating a photoresist layer;

performing an exposure step to the photoresist layer by utilizing a photo mask, the photo mask having a transparent area corresponding to a position between the two metal wires, an opaque material disposed in the transparent area, wherein a width of the transparent area of the photo mask is a resolution of the photo mask, and a width of the opaque material is less than the width of the transparent area of the photo mask;

performing a development step to the photoresist layer; and performing an etching step to remove a part of the indium tin oxide layer and a part of the organic layer.

After the step of performing the etching step to remove the part of the indium tin oxide layer and the part of the organic layer, the method for preventing the short circuit between the metal wires in the organic light emitting diode display device of the present invention further comprises a step of:

stripping a remaining part of the photoresist layer.

In the method for preventing the short circuit between the metal wires in the organic light emitting diode display device of the present invention, the width of the opaque material is less than 2 μm.

In the method for preventing the short circuit between the metal wires in the organic light emitting diode display device of the present invention, the width of the opaque material is preferably ranging from 1 μm to 2 μm.

In the method for preventing the short circuit between the metal wires in the organic light emitting diode display device of the present invention, the two metal wires are utilized as sources.

In the method for preventing the short circuit between the metal wires in the organic light emitting diode display device of the present invention, the two metal wires are utilized as drains.

In the method for preventing the short circuit between the metal wires in the organic light emitting diode display device of the present invention, the organic layer at least covers a part of the two metal wires.

In the method for preventing the short circuit between the metal wires in the organic light emitting diode display device of the present invention, the two metal wires are formed by a wet etching method.

To solve the above-mentioned problem, a method for preventing a short circuit between metal wires in an organic light emitting diode display device provided by the present invention comprises:

forming an inorganic layer on a substrate;

forming a metal layer on the inorganic layer, the metal layer comprising at least two metal wires;

forming an organic layer on the two metal wires of the metal layer;

forming an indium tin oxide layer on the organic layer;

coating a photoresist layer;

performing an exposure step to the photoresist layer by utilizing a photo mask, the photo mask having a transparent area corresponding to a position between the two metal wires, an opaque material disposed in the transparent area, wherein a width of the opaque material is less than a width of the transparent area of the photo mask;

performing a development step to the photoresist layer; and performing an etching step to remove a part of the indium tin oxide layer and a part of the organic layer.

After the step of performing the etching step to remove the part of the indium tin oxide layer and the part of the organic layer, the method for preventing the short circuit between the metal wires in the organic light emitting diode display device of the present invention further comprises a step of:

stripping a remaining part of the photoresist layer.

In the method for preventing the short circuit between the metal wires in the organic light emitting diode display device of the present invention, the width of the opaque material is less than 2 μm.

In the method for preventing the short circuit between the metal wires in the organic light emitting diode display device of the present invention, the width of the opaque material is preferably ranging from 1 μm to 2 μm.

In the method for preventing the short circuit between the metal wires in the organic light emitting diode display device of the present invention, the two metal wires are utilized as sources.

In the method for preventing the short circuit between the metal wires in the organic light emitting diode display device of the present invention, the two metal wires are utilized as drains.

In the method for preventing the short circuit between the metal wires in the organic light emitting diode display device of the present invention, the organic layer at least covers a part of the two metal wires.

In the method for preventing the short circuit between the metal wires in the organic light emitting diode display device of the present invention, the two metal wires are formed by a wet etching method.

Comparing with the prior arts, by disposing the opaque material of which the width is less than the width of the transparent area, the method for preventing the short circuit between the metal wires in the organic light emitting diode display device of the present invention is capable of decreasing the thickness of the organic layer after the etching step is performed. As a result, the indium tin oxide layer can be removed completely, and the short circuit between the metal wires can be prevented.

For a better understanding of the aforementioned content of the present invention, preferable embodiments are illustrated in accordance with the attached figures for further explanation:

DETAILED DESCRIPTION OF THE INVENTION

The following descriptions for the respective embodiments are specific embodiments capable of being implemented for illustrations of the present invention with referring to appended figures. For example, the terms of up, down, front, rear, left, right, interior, exterior, side, etcetera are merely directions of referring to appended figures. Therefore, the wordings of directions are employed for explaining and understanding the present invention but not limitations thereto.

Figure 3:
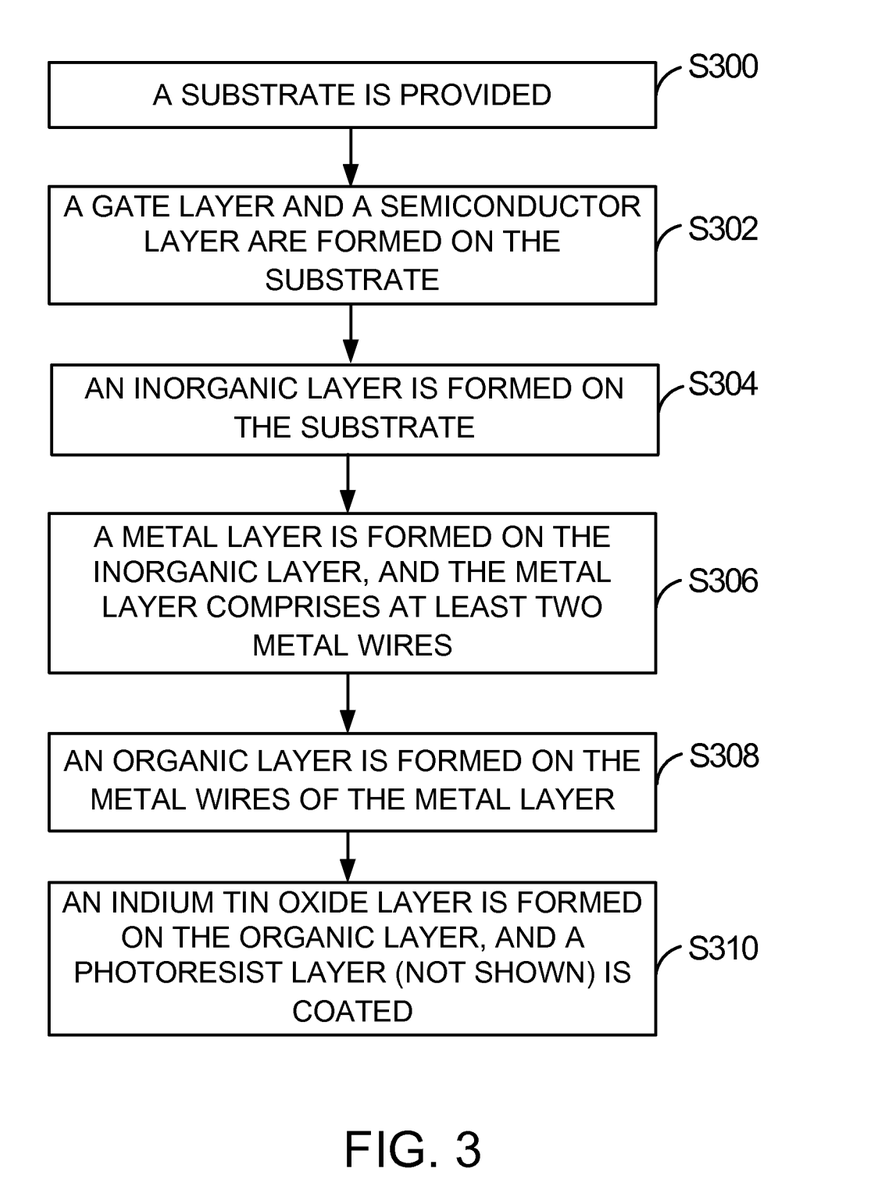
FIG. 3 illustrates a flow chart of a method for preventing a short circuit between metal wires in an organic light emitting diode display device in accordance with an embodiment of the present invention.
Figure 4:
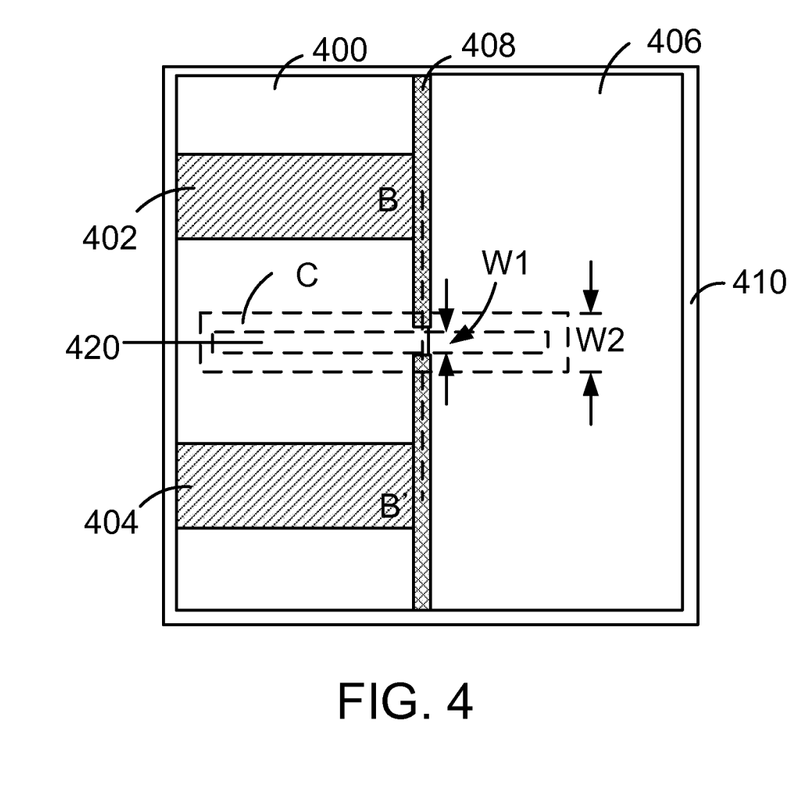
FIG. 4 illustrates a top view of some elements of the organic light emitting diode display device in accordance with the embodiment of the present invention.
Figure 5:
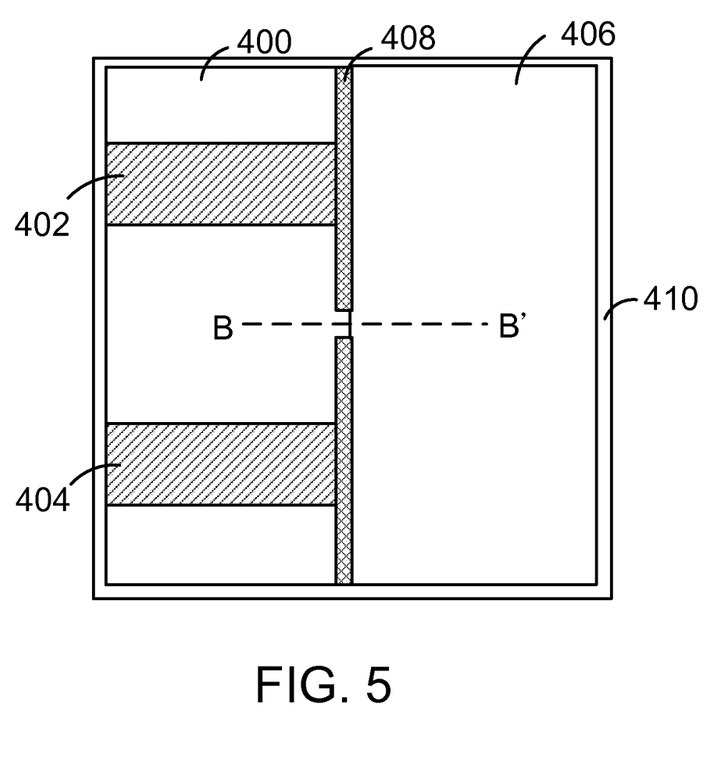
FIG. 5 illustrates a top view after the method of the present invention is implemented in FIG. 4.
Figure 6:
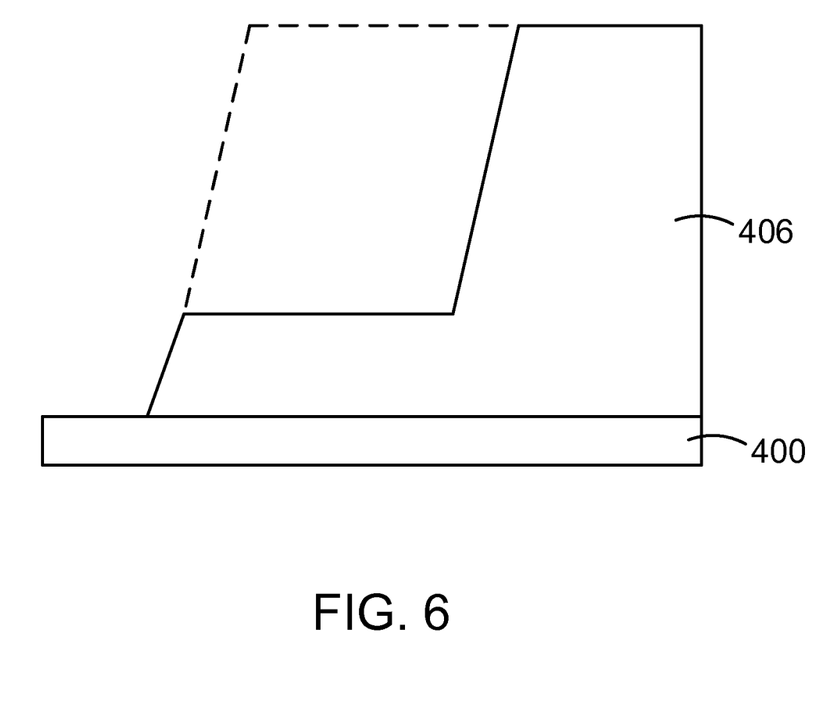
FIG. 6 illustrates a cross-sectional view along a line BB' in FIG. 5.

Please refer to FIG. 3 to FIG. 6. FIG. 3 illustrates a flow chart of a method for preventing a short circuit between metal wires in an organic light emitting diode display device in accordance with an embodiment of the present invention. FIG. 4 illustrates a top view of some elements of the organic light emitting diode display device in accordance with the embodiment of the present invention. FIG. 5 illustrates a top view after the method of the present invention is implemented in FIG. 4. FIG. 6 illustrates a cross-sectional view along a line BB' in FIG. 5.

In step S300, a substrate 410 is provided.

In step S302, a gate layer (not shown) and a semiconductor layer (not shown) are formed on the substrate 410.

It is noted that since formation methods of the gate layer (not shown) and the semiconductor layer (not shown) are the same as those in the prior arts and are not key points of the present invention, they are not shown in FIG. 4 to FIG. 6.

In step S304, an inorganic layer 400 is formed on the substrate 410. It is noted that an area of the inorganic layer 400 formed on the substrate 410 is different from an area of the gate layer (not shown) and the semiconductor layer (not shown) formed on the substrate 410.

In step 306, a metal layer is formed on the inorganic layer 400, and the metal layer comprises at least two metal wires 402 and 404 which are served as sources or drains. The metal wires 402 and 404 are respectively utilized for transmitting independent signals, that is, for transmitting different signals.

The two metal wires 402 and 404 are, for example, but are not limited to, formed by a wet etching method.

In step S308, an organic layer 406 is formed on the metal wires 402 and 404 of the metal layer. The organic layer 406 at least covers a part of the metal wire 402 and a part of the metal wire 404. The organic layer 406 and the inorganic layer 400 are utilized as insulating layers and have a flat function for improving quality of manufacturing an organic light emitting diode in the following process.

In step S310, an indium tin oxide (ITO) layer 408 is formed on the organic layer 406. The indium tin oxide layer 408 is utilized as an anode of the organic light emitting diode.

It is noted that a position of the light emitting diode is formed in a light emitting area (not shown) of the substrate 410, and FIG. 4 and FIG. 5 illustrates a thin film transistor area. The indium tin oxide layer 408 (utilized as the anode of the light emitting diode) is required to be formed only in the light emitting area (not shown), and the indium tin oxide layer 408 is not required to be formed in the thin film transistor area. Accordingly, the indium tin oxide layer 408 in the thin film transistor area is required to be removed.

Step S310 further comprises the following step: a photoresist layer (not shown) is coated.

In step S312, an exposure step is performed to the photoresist layer (not shown) by utilizing a photo mask (not shown). The photo mask (not shown) has a transparent area C corresponding to a position between the metal wires 402 and 404. An opaque material 420 is disposed in the transparent area C. A width W1 of the opaque material 420 is less than a width W2 of the transparent area C of the photo mask (not shown). The width W2 of the transparent area C is a resolution of the photo mask (not shown), that is, a resolution of an exposing machine. The transparent area C and the opaque material 420 are corresponding to a part of the inorganic layer 400 and a part of the organic layer 406.

Taking an exposing machine of Canon Kabushiki Kaisha for example, the resolution is 2.5 μm (micrometer). Accordingly, the width W1 of the opaque material 420 should be designed in a range from 0 μm to 2 μm. After experimental verification, the width W1 of the opaque material 420 is preferably ranging from 1 μm to 2 μm.

In step S314, a development step is performed to the photoresist layer (not shown).

In step S316, an etching step is performed to remove a part of the indium tin oxide layer 408 and a part of the organic layer 406. Since the width W1 of the opaque material 420 is less than the width W2 of the transparent area C, the organic layer 406 corresponding to an area between the transparent area C and the opaque material 420 is removed after the etching step. A removed part is shown as a dotted line area in FIG. 6. The organic layer 406 corresponding to an area of the opaque area 420 is not removed.

As shown in FIG. 6, since a thickness of the organic layer 406 in a border between the organic layer 406 and the inorganic layer 400 is decreased (that is, the dotted line area is removed), shadowing effect of the organic layer 406 does not occur. The indium tin oxide layer 408 can be irradiated by light, and thus the indium tin oxide layer 408 can be removed completely. The indium tin oxide 408 in the border between the inorganic layer 400 and the organic layer 406 is not left, thereby preventing a short circuit between the metal wires 402 and 404 in FIG. 4.

In step S318, a remaining part of the photoresist layer is stripped.

In step S320, a light emitting layer (not shown) and a cathode (now shown) are formed on the indium tin oxide layer in the light emitting area (not shown) in sequence for finishing the manufacturing of the organic light emitting diode.

It is noted that since formation methods of the light emitting layer (not shown) and the cathode (not shown) are not key points of the present invention, they are not shown in FIG. 4 to FIG. 6.

By disposing the opaque material 420 of which the width W1 is less than the width W2 of the transparent area C (step S314), the present invention is capable of decreasing the thickness of the organic layer 406 as shown in FIG. 6 after the etching step is performed to remove a part of the indium tin oxide layer 408 and a part of the organic layer 406 (step S320). As a result, the indium tin oxide layer 408 can be removed completely, and the short circuit between the metal wires 402 and 404 can be prevented.

As is understood by a person skilled in the art, the foregoing preferred embodiments of the present invention are illustrative rather than limiting of the present invention. It is intended that they cover various modifications and similar arrangements be included within the spirit and scope of the appended claims, the scope of which should be accorded the broadest interpretation so as to encompass all such modifications and similar structure.

What is claimed is:

1. A method for preventing a short circuit between metal wires in an organic light emitting diode display device, comprising:

forming an inorganic layer on a substrate;

forming a metal layer on the inorganic layer, the metal layer comprising at least two metal wires;

forming an organic layer on the two metal wires of the metal layer;

forming an indium tin oxide layer on the organic layer;

coating a photoresist layer;

performing an exposure step to the photoresist layer by utilizing a photo mask, the photo mask having a transparent area corresponding to a position between the two metal wires, an opaque material disposed in the transparent area, wherein a width of the transparent area of the photo mask is a resolution of the photo mask, and a width of the opaque material is less than the width of the transparent area of the photo mask;

performing a development step to the photoresist layer; and performing an etching step to remove a part of the indium tin oxide layer and a part of the organic layer.

2. The method for preventing the short circuit between the metal wires in the organic light emitting diode display device of claim 1, further comprising a step of stripping a remaining part of the photoresist layer after the step of performing the etching step to remove the part of the indium tin oxide layer and the part of the organic layer.

3. The method for preventing the short circuit between the metal wires in the organic light emitting diode display device of claim 1, wherein the width of the opaque material is less than 2 μm.

4. The method for preventing the short circuit between the metal wires in the organic light emitting diode display device of claim 3, wherein the width of the opaque material is preferably ranging from 1 μm to 2 μm.

5. The method for preventing the short circuit between the metal wires in the organic light emitting diode display device of claim 1, wherein the two metal wires are utilized as sources.

6. The method for preventing the short circuit between the metal wires in the organic light emitting diode display device of claim 1, wherein the two metal wires are utilized as drains.

7. The method for preventing the short circuit between the metal wires in the organic light emitting diode display device of claim 1, wherein the organic layer at least covers a part of the two metal wires.

8. The method for preventing the short circuit between the metal wires in the organic light emitting diode display device of claim 1, wherein the two metal wires are formed by a wet etching method.

9. A method for preventing a short circuit between metal wires in an organic light emitting diode display device, comprising:

forming an inorganic layer on a substrate;

forming a metal layer on the inorganic layer, the metal layer comprising at least two metal wires;

forming an organic layer on the two metal wires of the metal layer;

forming an indium tin oxide layer on the organic layer;

coating a photoresist layer;

performing an exposure step to the photoresist layer by utilizing a photo mask, the photo mask having a transparent area corresponding to a position between the two metal wires, an opaque material disposed in the transparent area, wherein a width of the opaque material is less than a width of the transparent area of the photo mask;

performing a development step to the photoresist layer; and performing an etching step to remove a part of the indium tin oxide layer and a part of the organic layer.

10. The method for preventing the short circuit between the metal wires in the organic light emitting diode display device of claim 9, further comprising a step of stripping a remaining part of the photoresist layer after the step of performing the etching step to remove the part of the indium tin oxide layer and the part of the organic layer.

11. The method for preventing the short circuit between the metal wires in the organic light emitting diode display device of claim 9, wherein the width of the opaque material is less than 2 μm.

12. The method for preventing the short circuit between the metal wires in the organic light emitting diode display device of claim 11, wherein the width of the opaque material is preferably ranging from 1 μm to 2 μm.

13. The method for preventing the short circuit between the metal wires in the organic light emitting diode display device of claim 9, wherein the two metal wires are utilized as sources.

14. The method for preventing the short circuit between the metal wires in the organic light emitting diode display device of claim 9, wherein the two metal wires are utilized as drains.

15. The method for preventing the short circuit between the metal wires in the organic light emitting diode display device of claim 9, wherein the organic layer at least covers a part of the two metal wires.

16. The method for preventing the short circuit between the metal wires in the organic light emitting diode display device of claim 9, wherein the two metal wires are formed by a wet etching method.

* * * * *